US010923661B2

(12) United States Patent
Bi

(10) Patent No.: US 10,923,661 B2
(45) Date of Patent: Feb. 16, 2021

(54) ORGANIC LIGHT EMITTING DIODE AND FABRICATING METHOD THEREOF

(71) Applicant: Shenzhen China Star Optoelectronics Semiconductor Display Technology Co., Ltd., Guangdong (CN)

(72) Inventor: Yanliang Bi, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/497,941

(22) PCT Filed: Apr. 24, 2019

(86) PCT No.: PCT/CN2019/084067
§ 371 (c)(1),
(2) Date: Sep. 26, 2019

(87) PCT Pub. No.: WO2020/199281
PCT Pub. Date: Oct. 8, 2020

(65) Prior Publication Data
US 2020/0321527 A1 Oct. 8, 2020

(51) Int. Cl.
*H01L 51/00* (2006.01)
*H01L 27/32* (2006.01)
*H01L 51/50* (2006.01)

(52) U.S. Cl.
CPC ...... *H01L 51/0007* (2013.01); *H01L 51/0005* (2013.01); *H01L 27/3246* (2013.01); *H01L 51/5012* (2013.01); *H01L 2251/308* (2013.01)

(58) Field of Classification Search
CPC ............. H01L 51/0007; H01L 27/3246; H01L 51/5012; H01L 51/5206
See application file for complete search history.

(56) References Cited

U.S. PATENT DOCUMENTS

2002/0001026 A1  1/2002  Ishikawa
2006/0045959 A1  3/2006  Yasukawa
(Continued)

FOREIGN PATENT DOCUMENTS

CN     1741693 A     3/2006
CN    101304075 A    11/2008
(Continued)

OTHER PUBLICATIONS

Machine Translation of CN 105244454 A.*

*Primary Examiner* — Anthony Ho
(74) *Attorney, Agent, or Firm* — Mark M. Friedman

(57) ABSTRACT

An organic light emitting diode includes a thin film transistor substrate, a pixel electrode layer, a pixel defining layer, and a pixel layer in order from bottom to top. The pixel layer is formed by spraying pixel ink onto the pixel electrode layer in the pixel defining groove by an inkjet printing method and drying to form a film, and the pixel ink contains a hydrophobic solvent and is hydrophobic. A method for fabricating an organic light emitting diode includes the steps of: providing a thin film transistor substrate, forming a pixel electrode layer, forming a pixel defining layer, and forming a pixel layer. By adding a hydrophobic solvent to the pixel ink and making the pixel ink hydrophobic, the coffee ring effect in the inkjet printing process is reduced, and the film surface of the pixel layer is uniform, thereby improving the luminescence performance.

9 Claims, 3 Drawing Sheets

(56) References Cited

U.S. PATENT DOCUMENTS

2008/0277654 A1 11/2008 Wang et al.
2019/0296239 A1 9/2019 Jia

FOREIGN PATENT DOCUMENTS

| CN | 105244454 A | * | 1/2016 |
| CN | 108400259 A | | 8/2018 |

* cited by examiner

ORGANIC LIGHT EMITTING DIODE AND FABRICATING METHOD THEREOF

FIELD OF INVENTION

This invention relates to the field of display technologies, and, in particular, to an organic light emitting diode and fabricating method thereof.

BACKGROUND OF INVENTION

Organic Light Emitting Diode (OLED) has been widely used in display, lighting and smart wearable devices due to its good self-luminous characteristics, high contrast and fast response.

At present, there are two key factors that restrict the mass production of organic light emitting diodes by inkjet printing (IJP). One is the performance of the device, i.e., the problem of uniformity of illumination. The other is the lifetime of organic light emitting diodes. The uniformity of luminescence is determined by the film characteristics of the pixel layer between the banks. If the film surface is uniform and the film is in good contact with other films, the light generated thereby is uniform and has a good brightness.

FIG. 1 is a schematic view of a process for fabricating an organic light emitting diode by inkjet printing in the prior art. The printing process is to form a pixel electrode layer 90 on a thin film transistor substrate 9, pattern the pixel electrode layer 90, and then form banks 91 on the thin film transistor substrate 9 and the pixel electrode layer 90. The pixel electrode layer 90 at the bottom is hydrophilic, and the banks 91 surrounding the pixel electrode layer 90 is hydrophobic. The edge portion of the pixel electrode layer 90 is covered with the banks 91. Then pixel ink 92 is printed on the pixel electrode layer 90 exposed from the banks 91 by inkjet printing, and the pixel ink 92 is dried to form a pixel layer 93. However, since in the process of drying of the film, the edge portion of the pixel ink 92 is evaporated faster than the middle portion of the pixel ink 92, thereby causing the circumferential periphery of the film surface to be high and the middle portion thereof to be low, resulting in that a film surface of the pixel layer 93 is uneven, which is called the coffee-ring effect. The uneven film surface causes uneven brightness. How to effectively solve the coffee ring effect, thereby improving the uniformity of the film surface of the pixel layer 93, and improving the luminescence performance is the key to solve the problem of uniformity of luminescence of organic light emitting diodes.

SUMMARY OF INVENTION

In order to solve the above problems, the present invention provides an organic light emitting diode, including a thin film transistor substrate, a pixel electrode layer, a pixel defining layer, and a pixel layer in order from bottom to top. The pixel defining layer includes banks and a pixel defining groove surrounded by the banks, the pixel defining groove is disposed corresponding to the pixel electrode layer, and at least a portion of the pixel electrode layer are exposed in the pixel defining groove. The pixel layer is formed by spraying pixel ink on the pixel electrode layer in the pixel defining groove by inkjet printing, wherein the pixel ink is dried to form a film, and wherein the pixel ink contains a hydrophobic solvent and is hydrophobic.

Further, formation of the film from the pixel ink sprayed in the pixel defining groove is achieved by drying through vacuum exhaustion, whereby the hydrophobic solvent in the pixel ink is volatilized.

Further, a molecular weight of the hydrophobic solvent is <500.

Further, the hydrophobic solvent has a hydrogen bonding.

Further, the hydrophobic solvent is volatilized or decomposed after heat treatment.

Further, a contact angle between the pixel ink and the pixel electrode layer is greater than 110° and less than 180°.

Further, a ratio of the hydrophobic solvent to the pixel ink is less than 10%.

Further, material of the pixel electrode layer is indium tin oxide (ITO).

Further, the surface of the pixel electrode layer is hydrophobic.

The present invention further provides a method of fabricating an organic light emitting diode, including the steps of:

providing a thin film transistor substrate;

forming a pixel electrode layer on the thin film transistor substrate;

forming a pixel defining layer on the thin film transistor substrate, wherein the pixel defining layer has banks and a pixel defining groove surrounded by the banks, the pixel defining groove and the pixel electrode layer are correspondingly disposed, and at least a portion of the pixel electrode layer is exposed in the pixel defining groove; and forming a pixel layer by spraying pixel ink on the pixel electrode layer in the pixel defining groove by inkjet printing, and drying the pixel ink by vacuum exhaustion to form the pixel layer, wherein the pixel ink is hydrophobic.

The present invention provides an organic light emitting diode and a fabricating method thereof. By changing the composition of the pixel ink, and making the pixel ink contain a hydrophobic solvent and be hydrophobic, the problem of the coffee ring effect in the inkjet printing process can be solved, and the film surface of the pixel layer is uniform, thereby improving the luminescence performance. Besides, by vacuum exhaustion and heating the pixel ink to form the film, the hydrophobic solvent can be volatilized without affecting the performance of the final device. Further, by making the surface of the pixel electrode layer hydrophobic, the droplets of the pixel ink are in a contracted and gathered state, thereby further ensuring uniformity of the film surface of the pixel layer, and improving luminescence performance.

Figure 1:
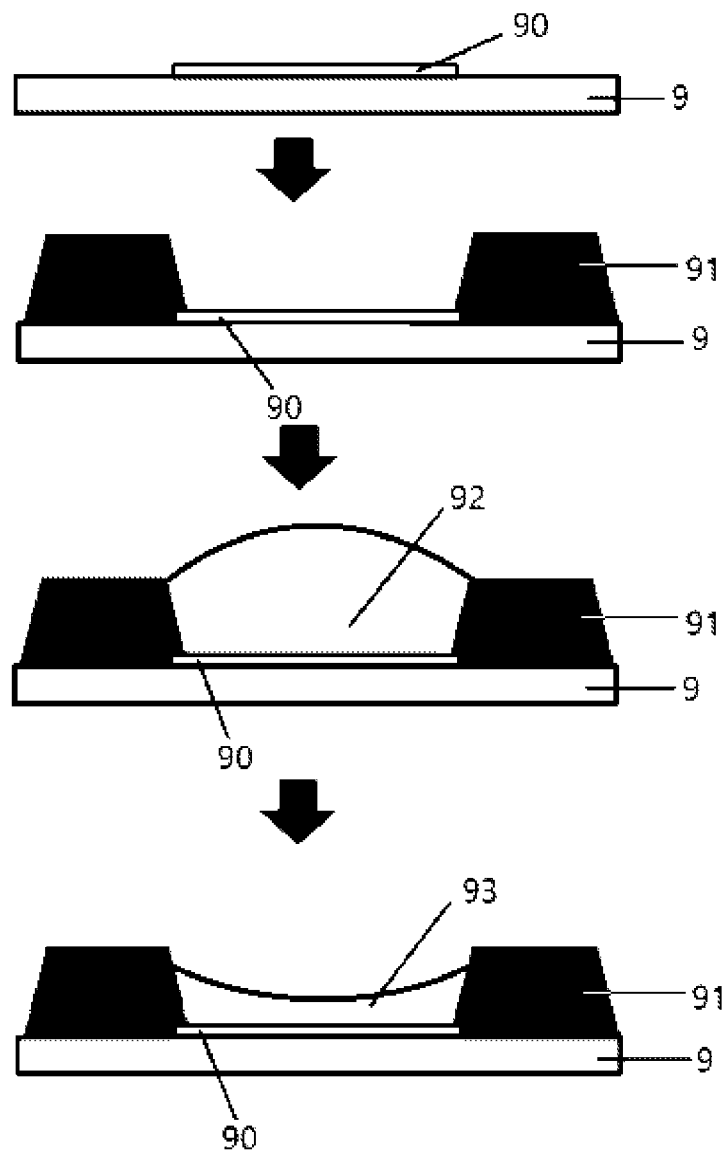
FIG. 1 is a schematic view of a conventional process for fabricating an organic light emitting diode.

Reference numbers and related parts in the drawings:

1. thin film transistor substrate 2. pixel electrode layer 3. pixel defining layer 4. pixel layer 31. bank 32. pixel defining groove 41. pixel ink

DETAILED DESCRIPTION OF PREFERRED EMBODIMENTS

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", "clockwise", "counter-clockwise", etc. are based on the orientation or positional relationship shown in the drawings, and are merely for the convenience of the description of the present invention. These are not intended to indicate or imply that the device or component has a specific orientation, and is constructed and operated in a specific orientation. Therefore, it cannot be understood as a limitation on the present invention. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present invention, the meaning of "a plurality" is two or more, unless specifically defined otherwise.

Figure 2:
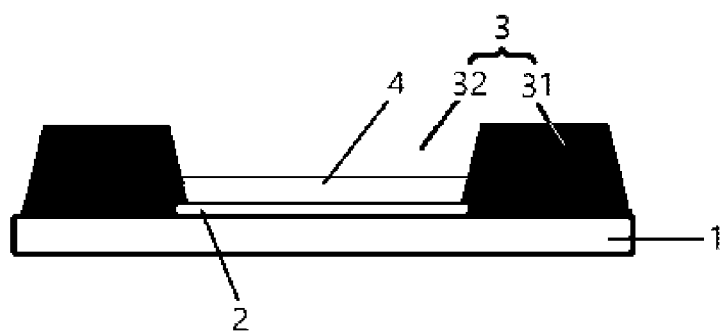
FIG. 2 is a schematic view of an organic light emitting diode according to an embodiment of the invention.

Please refer to FIG. 2; in an embodiment, an organic light emitting diode of the present invention includes a thin film transistor substrate 1, a pixel electrode layer 2, a pixel defining layer 3, and a pixel layer 4 in order from bottom to top.

As shown in FIG. 2, the pixel defining layer 3 is disposed on the thin film transistor substrate 1 and partially stacked on the pixel electrode layer 2; that is, a portion of the pixel defining layer 3 overlaps with the pixel electrode layer 2. Specifically, in the embodiment, the pixel defining layer 3 includes banks 31, and a pixel defining groove 32 surrounded by the banks 31. The pixel defining groove 32 is disposed corresponding to the pixel electrode layer 2, and at least a portion of the pixel electrode layer 2 is disposed within the pixel defining groove 32. In other words, the banks 31 surround the pixel electrode layer 2. In this embodiment, an edge portion of the pixel electrode layer 2 is disposed below the pixel defining layer 3, and a central portion of the pixel electrode layer 2 is exposed in the pixel defining groove 32.

Figure 5:
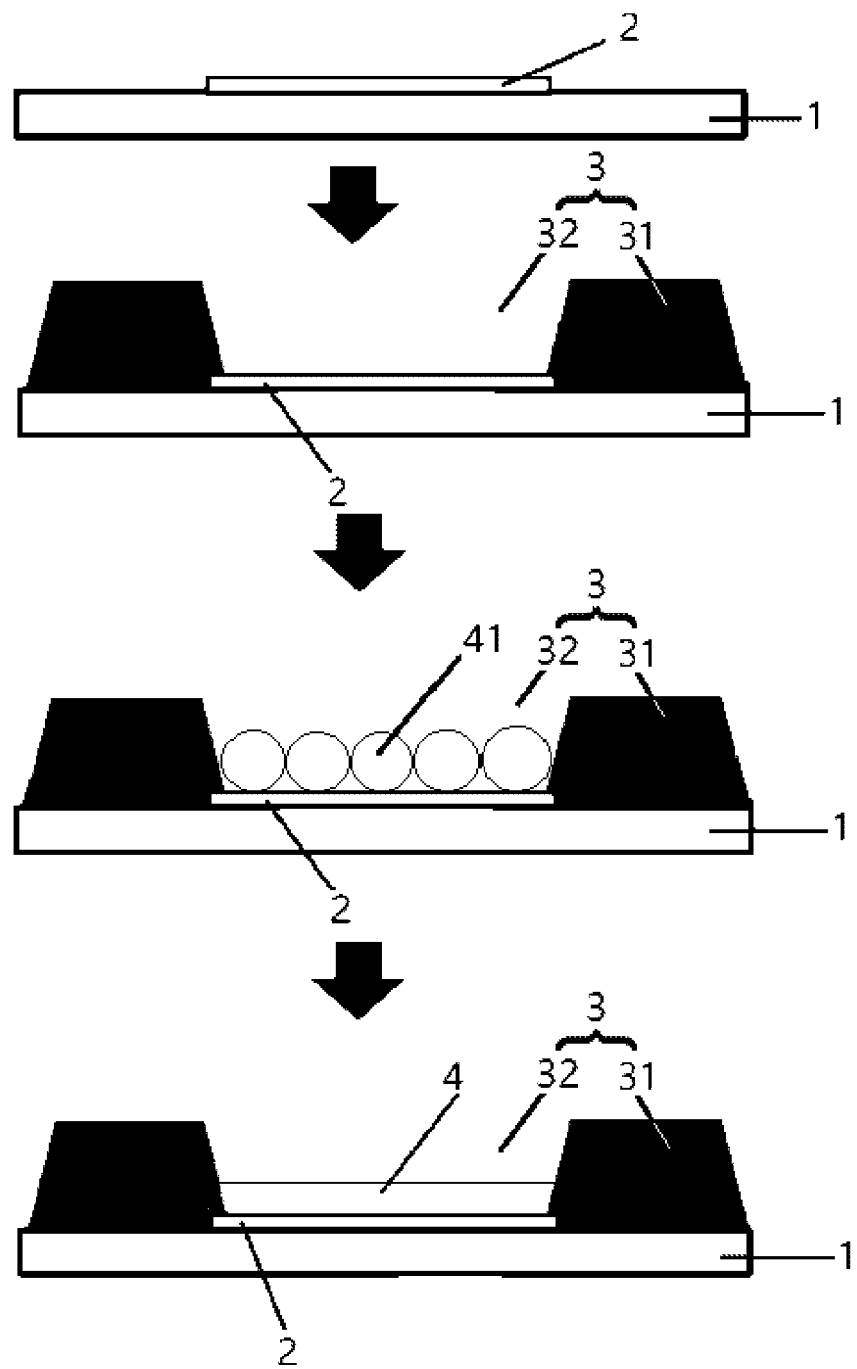
FIG. 5 is a schematic view of the process of fabricating the organic light emitting diode of FIG. 4.

As shown in FIG. 2, the pixel layer 4 is disposed in the pixel defining groove 32 and stacked on the pixel electrode layer 2 to connect with the pixel electrode layer 2. Referring to FIG. 5, the pixel layer 4 is formed by spraying pixel ink 41 onto the pixel electrode layer 2 in the pixel defining groove 32 by inkjet printing and drying to form a film.

The pixel ink 41 contains a hydrophobic solvent and is hydrophobic, so that a surface contact angle between the pixel ink 41 and the pixel defining layer 3 becomes larger. When the number of droplets is small, the droplets will be spherical and cannot spread to form a film. When the droplets reach a certain amount (determined by the size of the pixel area), the droplets are each in a contracted manner and connected together and in a gathered state, and then the gathered droplets are dried by vacuum exhaustion to volatilize the solvent to form a film having a uniform film surface.

Figure 3:
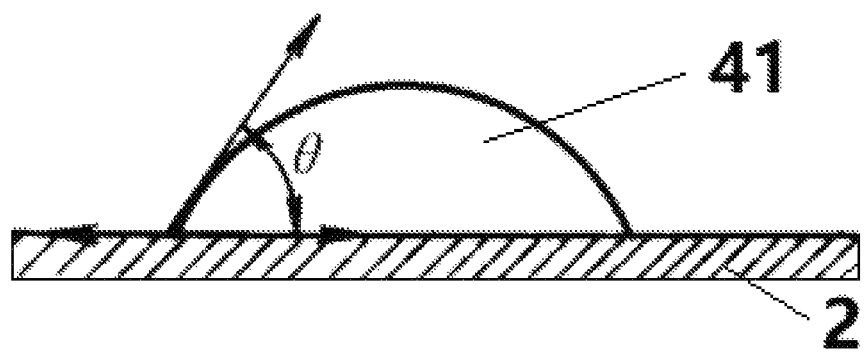
FIG. 3 is a schematic view of the principle of hydrophilicity of a pixel ink of the present invention.

Please refer to FIG. 3; the pixel ink 41 is usually made of a mixture of organic materials, wherein the molecular structures, group types, and lengths of molecular chain of the various organic materials are different. Material of the pixel ink 41 includes a hydrophilic group and a hydrophobic group, and the hydrophilicity of the whole material is changed by adjusting the ratio of the two groups. When an angle θ between the surface of the pixel ink 41 and the surface of the pixel electrode layer 2, i.e. the contact angle of the pixel ink 41, is less than 90°, the pixel ink 41 is hydrophilic. When the angle θ is greater than 90°, the pixel ink 41 is hydrophobic. The method of the present invention for improving the hydrophobicity of the pixel ink 41 which is originally hydrophilic is performed by adding a surfactant additive having a hydrophobic group into the pixel ink. By adjusting the amount of the hydrophobic solvent, i.e. the hydrophobic additive, the contact angle θ of the pixel ink 41 is at least greater than 110° and less than 180°. The amount of additive used should be less than 10% in portion to the pixel ink in total. Within this range, the larger contact angle θ is preferred. The pixel ink is an organic material, it cannot be in contact with oxygen, and it is easily damaged by ozone, so changing the material properties of the pixel ink 41 has the least influence on the performance of the organic light emitting diode.

Generally, the alkyl-based long-chain structure has a hydrophobic function. The hydrophobic solvent added to the pixel ink 41 of the present invention has a long molecular chain of an alkyl structure, and a molecular weight <500. The hydrophobic solvent has no chemical reaction with the pixel ink 41, and only has hydrogen bonding, that provides good adhesion and mixed dispersibility. Then the hydrophobic solvent is volatilized or decomposed by heat treatment, which does not affect the performance of the final organic light emitting diode.

Material of the pixel electrode layer 2 is indium tin oxide. The surface of the pixel electrode layer 2 is hydrophobic. By modifying the surface of the indium tin oxide to reduce the hydrophilicity of the pixel ink 41, it can increase the contact angle between the surface of the pixel ink 41 and the surface of the indium tin oxide, such that the number of the droplets of the pixel ink 41 climbing up the sidewall of the banks is reduced, and the uniformity of the film surface is improved.

Figure 4:
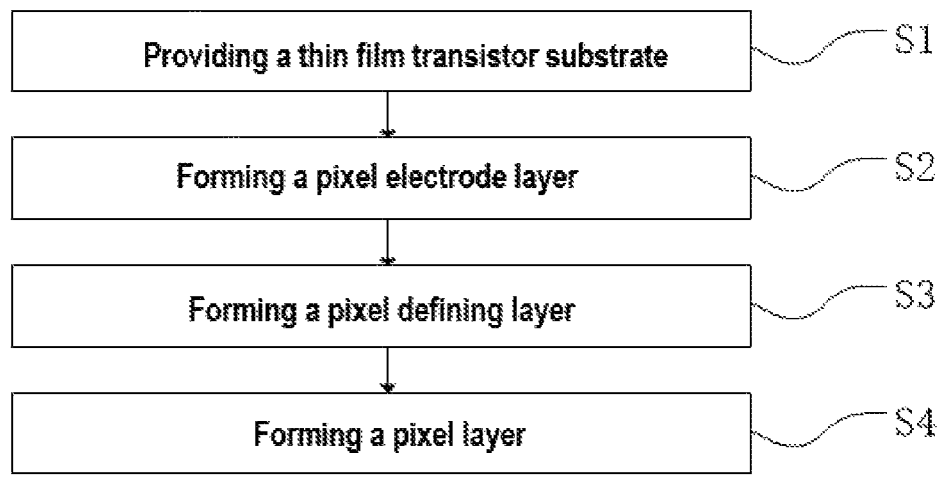
FIG. 4 is a flow chart of fabricating an organic light emitting diode according to an embodiment of the invention.

Please refer to FIG. 4-5; in an embodiment, a method for fabricating the organic light emitting diode of the present invention includes steps S1-S4.

S1: providing a thin film transistor substrate 1.

S2: forming a pixel electrode layer 2. The pixel electrode layer 2 is formed on the thin film transistor substrate 1. The pixel electrode layer 2 having a hydrophobic surface is preferred, so that the droplets of the pixel ink 41 can each be in a contracted and connected together and in a gathered state, thereby further ensuring uniformity of the film surface of the pixel layer 4.

S3: forming a pixel defining layer 3. Specifically, the pixel defining layer 3 is formed on the thin film transistor substrate 1, and a part of the pixel defining layer 3 is stacked on the pixel electrode layer 2. The pixel defining layer 3 has at least two banks 31, two adjacent ones of the banks 31 constitute a pixel defining groove 32. The pixel defining groove 32 being disposed corresponding to the pixel electrode layer 2, and at least a portion of the pixel electrode layer 2 is disposed within the pixel defining groove 32.

S4: forming a pixel layer 4. The pixel ink 41 is sprayed on the pixel electrode layer 2 in the pixel defining groove 32 by inkjet printing. The pixel ink 41 is hydrophobic, and the pixel ink 41 is dried by vacuum exhaustion to form the pixel layer 4.

Referring to FIG. 5, the pixel ink 41 contains a hydrophobic solvent and is hydrophobic, so that the contact angle between the surface of the pixel ink 41 and the surface of the pixel defining layer 3 is increased. When the number of droplets is small, the droplets cannot spread to form a film. When the droplets reach a certain amount (determined by the size of the pixel area), the droplets are each in a contracted manner and connected together and in a gathered state, and then the droplets are dried by vacuum exhaustion to volatilize the solvent to form a film having a uniform film surface.

The present invention provides an organic light emitting diode and a fabricating method thereof. By changing the composition of the pixel ink, and making the pixel ink contain a hydrophobic solvent and be hydrophobic, the problem of the coffee ring effect in the inkjet printing process can be solved, and the film surface of the pixel layer is uniform, thereby improving the luminescence performance. Besides, by vacuum exhaustion and heating the pixel ink to form the film, the hydrophobic solvent can be volatilized without affecting the performance of the final device. Further, by making the surface of the pixel electrode layer hydrophobic, the droplets of the pixel ink are each in a contracted manner and connected together and in a gathered state, thereby further ensuring uniformity of the film surface of the pixel layer, and improving luminescence performance.

The above description is only a preferred embodiment of the present invention, and it should be noted that those skilled in the art can also make several improvements and retouches without departing from the principles of the present invention. These improvements and retouches should also be considered for the protection scope of the present invention.

What is claimed is:

1. An organic light emitting diode, comprising:
   a thin film transistor substrate;
   a pixel electrode layer disposed on the thin film transistor substrate;
   a pixel defining layer disposed on the thin film transistor substrate, the pixel defining layer comprising banks and a pixel defining groove surrounded by the banks, the pixel defining groove disposed corresponding to the pixel electrode layer, and at least a portion of the pixel electrode layer exposed in the pixel defining groove; and
   a pixel layer disposed on the pixel electrode layer in the pixel defining groove,
   wherein the pixel layer is formed by spraying pixel ink on the pixel electrode layer in the pixel defining groove by inkjet printing, wherein the pixel ink is dried to form a film, and wherein the pixel ink contains a hydrophobic solvent and is hydrophobic,
   wherein a surface of the pixel electrode layer is hydrophobic.

2. The organic light emitting diode as claimed in claim 1, wherein formation of the film from the pixel ink sprayed in the pixel defining groove is achieved by drying through vacuum exhaustion, whereby the hydrophobic solvent in the pixel ink is volatilized.

3. The organic light emitting diode as claimed in claim 1, wherein a molecular weight of the hydrophobic solvent is <500.

4. The organic light emitting diode as claimed in claim 1, wherein the hydrophobic solvent has a hydrogen bonding.

5. The organic light emitting diode as claimed in claim 1, wherein the hydrophobic solvent is volatilized or decomposed after heat treatment.

6. The organic light emitting diode as claimed in claim 1, wherein a contact angle between the pixel ink and the pixel electrode layer is greater than 110° and less than 180°.

7. The organic light emitting diode as claimed in claim 1, wherein a ratio of the hydrophobic solvent to the pixel ink is less than 10%.

8. The organic light emitting diode as claimed in claim 1, wherein material of the pixel electrode layer is indium tin oxide (ITO).

9. A method of fabricating the organic light emitting diode as claimed in claim 1, comprising steps of:
   providing the thin film transistor substrate;
   forming the pixel electrode layer on the thin film transistor substrate;
   forming the pixel defining layer on the thin film transistor substrate, the pixel defining layer comprising the banks and the pixel defining groove surrounded by the banks, the pixel defining groove and the pixel electrode layer being correspondingly disposed, and at least the portion of the pixel electrode layer being exposed in the pixel defining groove; and
   forming the pixel layer by spraying the pixel ink on the pixel electrode layer in the pixel defining groove by inkjet printing, and drying the pixel ink by vacuum exhaustion to form the pixel layer, wherein the pixel ink is hydrophobic,
   wherein a surface of the pixel electrode layer is hydrophobic.

* * * * *

UNITED STATES PATENT AND TRADEMARK OFFICE
CERTIFICATE OF CORRECTION

PATENT NO. : 10,923,661 B2  
APPLICATION NO. : 16/497941  
DATED : February 16, 2021  
INVENTOR(S) : Yanliang Bi Page 1 of 1

It is certified that error appears in the above-identified patent and that said Letters Patent is hereby corrected as shown below:

On the Title Page

Item (30) Foreign Application Priority Data:  
Insert --April 4, 2019 (CN) 201910270966.X--

Signed and Sealed this  
Eighteenth Day of May, 2021

Drew Hirshfeld  
*Performing the Functions and Duties of the*  
*Under Secretary of Commerce for Intellectual Property and*  
*Director of the United States Patent and Trademark Office*